United States Patent [19]

Cathey, Jr. et al.

[11] Patent Number: 4,992,137

[45] Date of Patent: Feb. 12, 1991

[54] DRY ETCHING METHOD AND METHOD FOR PREVENTION OF LOW TEMPERATURE POST ETCH DEPOSIT

[75] Inventors: David A. Cathey, Jr.; Harlan Frankamp, both of Boise, Id.

[73] Assignee: Micron Technology, Inc., Boise, Id.

[21] Appl. No.: 555,100

[22] Filed: Jul. 18, 1990

[51] Int. Cl.[5] .................. B44C 1/22; C03C 15/00; C03C 25/06
[52] U.S. Cl. ............................ 156/643; 156/646; 156/657; 156/659.1; 156/662; 204/192.37
[58] Field of Search ............... 156/643, 646, 651, 653, 156/657, 659.1, 662; 204/192.32, 192.37; 427/38, 39

[56] References Cited

U.S. PATENT DOCUMENTS 4,784,719 11/1988 Schutz ...................... 156/657 X
4,948,462 8/1990 Rossen ....................... 156/643

Primary Examiner—William A. Powell
Attorney, Agent, or Firm—Wells, St. John & Roberts

[57] ABSTRACT

A method of preventing low temperature dry etch deposit on a semiconductor substrate wafer comprises:
  ceasing injection of reactive gas to within a dry etching reactor at substantial completion of a selective etch while maintaining sufficient power to the reactor to maintain gases therein in a plasma state; and
  substantially evacuating the reactive gas plasma from the reactor before decreasing power to the reactor below that which is sufficient to maintain gases therein in the plasma state.

23 Claims, 1 Drawing Sheet

DRY ETCHING METHOD AND METHOD FOR PREVENTION OF LOW TEMPERATURE POST ETCH DEPOSIT

TECHNICAL FIELD

This invention relates to dry etching of semiconductor substrate wafers.

BACKGROUND OF THE INVENTION

Integrated circuits are formed on semiconductor silicon substrate wafers by a series of layering, patterning and doping steps. Patterning typically involves photolithography where a layer of photoresist is applied and then selectively removed in a masking step. This exposes those areas in the upper layer of the wafer which are to be removed or etched away.

Etching is done either using a wet chemical etch or a dry etching method. This disclosure concerns dry etching methods. The term "dry etching" is a collective definition for any of plasma etching, ion beam etching, reactive ion etching (RIE), magnetically enhanced ion etching (MIE), electrocyclotron resonance etching (ECR), and magnetically confined cyclotron resonance etching (MCR).

It is known that reducing wafer temperature during a dry etch (a) increases resist selectivity; (b) increases selectivity to other films; and (c) enhances sidewall passivation thereby preventing photoresist undercutting and promoting anisotropic etching. "Selectivity" is a term which defines the removal of the underlying material or film. The better the selectivity for a given material, the less that material will be etched under given etch conditions. "Sidewall passivation" is the combination of the reactive etchant material with the sidewalls of the opening of the substrate material as etching proceeds down into a desired layer. A film forms on these sidewalls which retards etching in the lateral direction, thereby producing substantially straight sidewalls. The film is removed in a later processing step after etching is completed.

It is therefore desirable in most dry etching processes to maintain the wafer at a temperature which is very low to maximize the above advantages. The lowest practical cooling temperature presently employed is around 20° C. because of an effect commonly known as low temperature post etch deposit. This known phenomenon becomes a problem below 20° C., and becomes very pronounced at temperatures of 0° C. and below.

The deposit results from reaction byproducts which form from the etchant materials after power to the reactor has been shut off at the conclusion of the desired etch. When power to the reactor is cut, the front (exposed) side of the wafer will no longer be heated by plasma. Further, the etchant byproducts will no longer be receiving excitation from plasma state electron collisions. As such, conditions become very favorable for deposition of compounds from the gas phase onto the cooled wafer.

With some etchant materials, the reaction byproducts are a result of reaction of the etchant materials with one another which then merely condense onto the cold wafer surface when power is interrupted. With other etchants, the undesired deposits result from a reaction of the etchant material with the material on the substrate wafer upon the interruption of power. Both mechanisms are highly undesirable. The lower the temperature to which the backside of the wafer is cooled, the more favorable the conditions for this adverse deposition.

FIG. 1 is a microscopic perspective view of a silicon substrate wafer illustrating the effects of low temperature post etch deposit. There illustrated is a silicon wafer 10 after a low temperature etch has been completed. Wafer 10 includes a series of conductive runners 12, 14, 16, and 18. The upper layer of runners 12, 14, 16, and 18 includes a layer of photoresist 18a, 18b, 18c, and 18d respectively. The spaces between the runners have been etched away to define channels 22, 24 and 26. The mass of material represented by numeral 28 is an undesired post etch deposit. Such a condition was obtained, in a low temperature etch of $SiO_2$ which is selective to silicon. Example conditions would be an etch in an Elechtrotech omega-II RIE reactor with the temperature beneath the wafer maintained at −10° C.; a first etching step conducted at 102 mtorr, 140 watts, 80 sccm $SF_6$, and 11 sccm Ar for 2 minutes and 45 seconds; followed by a second etching step at 110 mtorr, 100 watts, and 50 sccm $Cl_2$ for 1 minute and 15 seconds.

One object of this invention is to prevent low temperature dry etch deposit on a semiconductor substrate wafer in order to enable lower temperature dry etching.

BRIEF DESCRIPTION OF THE DRAWINGS

The preferred embodiment of the invention is referred to by reference to the accompanying drawings, in which.

DETAILED DESCRIPTION OF THE PREFERRED EMBODIMENTS

The following disclosure of the invention is submitted in furtherance with the constitutional purpose of the Patent Laws "to promote the progress of science and useful arts" (Article 1, Section 8).

In one aspect of the invention, a preferred method of dry etching a layer on a semiconductor substrate wafer within a reactor having cooling means for cooling a wafer position therein is disclosed. According to the method, a wafer is first positioned within the reactor. At least one gas is injected into the reactor, the gas being reactive when in a plasma state with the material on the wafer. A preselected amount of electrical power is applied to the reactor for a preselected amount of time to selectively obtain the desired etch of the layer.

At the completion of the desired etch, injection of the reactive gas into the reactor is stopped while some minimum amount of electrical power is applied to the reactor to maintain gases (etchant material) present therein in the plasma state. This minimum amount of power will typically be something greater than or equal to about 50W for an Elechtrotech omega-II RIE reactor.

Another gas is injected into the reactor while injection of the reactive gas has been stopped and while the minimum amount of electrical power is still being applied to the reactor. This other gas should be substantially inert to reaction with the material on the wafer to avoid significant further etching. By way of example only, the inert gas could be any of the noble gases, $N_2$, or mixtures thereof. Injection of the substantially inert gas should occur for a time sufficient to substantially purge the reactor volume of the reactive gas or gases while the minimum amount of electrical power is being applied. This will prevent the reactive byproduct gases from depositing onto the substrate.

In accordance with the invention, a method of preventing low temperature dry etch deposit on a semiconductor substrate wafer comprises, (a) ceasing injection of reactive gas to within a dry etching reactor at substantial completion of a selective etch while maintaining sufficient power to the reactor to maintain gases therein in a plasma state; and (b) evacuating a significant portion of the reactive gases from the reactor before decreasing power to the reactor below that which is sufficient to maintain gases therein in the plasma state.

Figure 1:
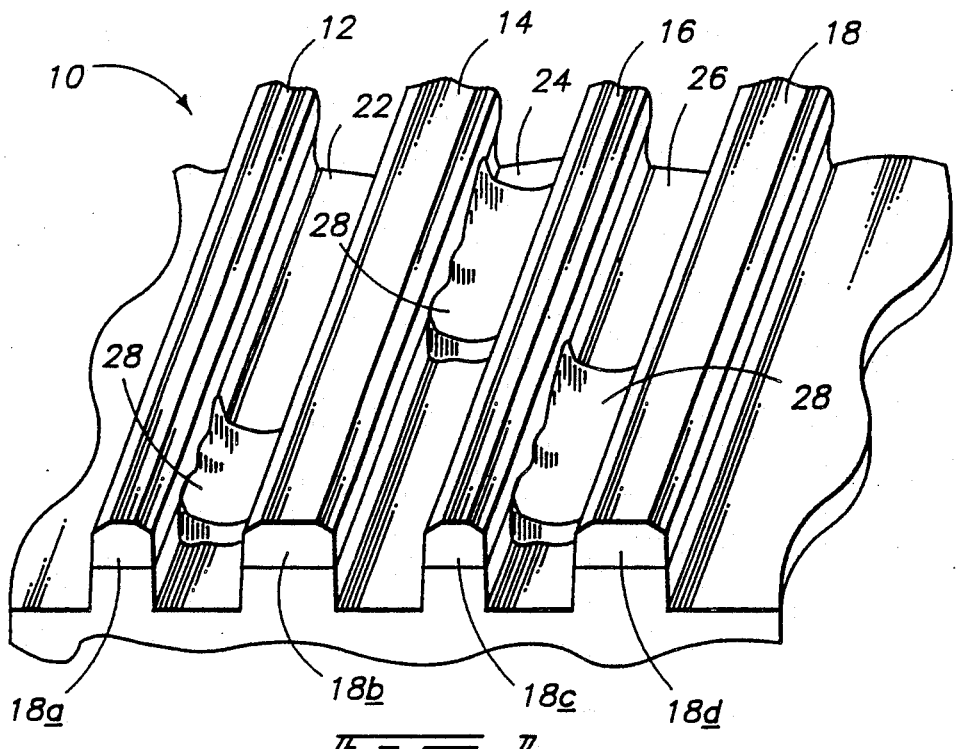
FIG. 1 is a microscopic perspective illustration of a prior art etch illustrating the effects of low temperature dry etch deposit, and is discussed in the Background section above.
Figure 2:
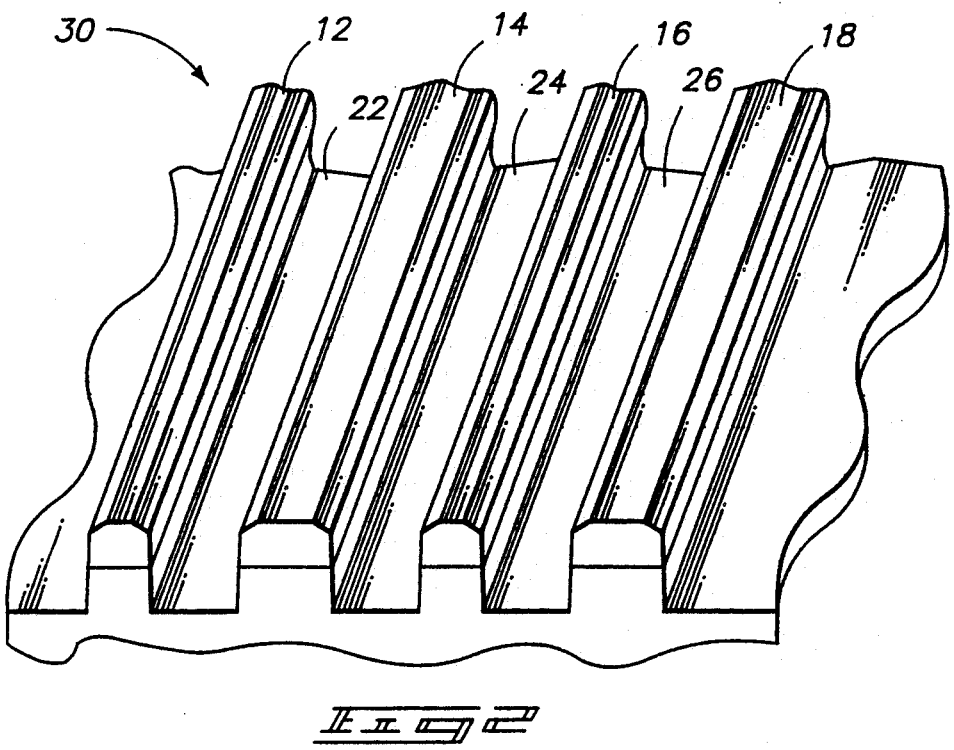
FIG. 2 is a microscopic perspective view of a silicon substrate wafer etched in accordance with the invention.

The above described method effects the evacuation by injection of an inert purge gas to expel the reactive gas or gases from the reactor. FIG. 2 illustrates a semiconductor wafer etched in accordance with the above described method. There illustrated is a wafer 30 of the same configuration as that shown in FIG. 1. As is apparent, no post etch deposit is present in any of channels 22, 24 or 26. Such a profile was obtained using the same equipment for the etching illustrated by FIG. 1 with the wafer being cooled to $-10°$ C. The method comprised the following three steps. First, at 120 mtorr and 140 watts, 80 sccm of $SF_6$ and 11 sccm of Ar were injected for 2 minutes 45 seconds. Second, at 110 mtorr and 100 watts, 50 $Cl_2$ were injected for 1 minute and 15 seconds. Third, at 100 mtorr and 100 watts, 50 sccm of Ar were injected for 1 minute and 30 seconds. The argon of the third step functioned as the inert purge gas.

In accordance with another aspect of the invention, the evacuation of the reactive gas occurs by maintaining a vacuum suction force in an evacuation opening communicating with the reactor while injection of gases into the reactor has substantially ceased. Dry etching reactors include vacuum openings to withdraw the spent etchant material from the reactor as etching progresses. It would also be possible to withdraw a substantial portion of the reactive gases from the reactor at the conclusion of the etch by merely maintaining this vacuum suction force after injection has ceased and while sufficient power is supplied to maintain the remaining etchant material in the plasma state. It is expected however that this latter method will not be as effective as an inert gas purge in removing all residual reactive etchant material. It will however remove a significant portion of the reactive etched material to have a positive effect on reduction of post etch deposit.

The above described method enables wafer cooling to temperatures well below 20° C. which promotes selectivity and sidewall passivation mechanisms. It is expected that the disclosed methods would be effective to at least $-70°$ C., and perhaps lower.

In compliance with the statute, the invention has been described in language more or less specific as to structural and methodical features. It is to be understood, however, that the invention is not limited to the specific features shown and described, since the means and construction herein disclosed comprise the preferred forms of putting the invention into effect. The invention is, therefore, claimed in any of its forms or modifications within the proper scope of the appended claims appropriately interpreted in accordance with the doctrine of equivalents.

We claim:

1. A method of dry etching a layer on a semiconductor substrate wafer within a reactor, the reactor having cooling means for cooling a wafer positioned within the reactor, the method comprising:

positioning a wafer within the reactor;

injecting at least one gas to within the reactor, the one gas being reactive when in a plasma state with material on the wafer;

applying a preselected amount of electrical power to the reactor with the wafer therein for a preselected amount of time to selectively obtain a desired dry etch of the layer;

stopping injection of the at least one gas to within the reactor at the completion of the desired etch while some minimum amount of electrical power is being applied to the reactor to maintain gases present therein in the plasma state;

injecting another gas into the reactor while injection of the one gas has been stopped and while the minimum amount of electrical power is being applied to the reactor, the other gas being substantially inert to reaction with material on the wafer; and continuing injecting the substantially inert gas for a time sufficient to substantially purge the reactor of the at least one reactive gas while the minimum amount of electrical power is being applied.

2. The dry etching method of claim 1 comprising cooling the wafer with the cooling means during the etch to a temperature less than 20° C.

3. The dry etching method of claim 1 comprising cooling the wafer with the cooling means during the etch to a temperature less than or equal to about 0° C.

4. The dry etching method of claim 1 comprising cooling the wafer with the cooling means during the etch to a temperature between about 0° C. and $-70°$ C.

5. The dry etching method of claim 1 wherein the minimum amount of electrical power is greater than or equal to about 50W.

6. The dry etching method of claim 1 wherein the minimum amount of electrical power is greater than or equal to about 50W, and further comprising:

cooling the wafer with the cooling means during the etch to a temperature less than 20° C.

7. The dry etching method of claim 1 wherein the minimum amount of electrical power is greater than or equal to about 50W, and further comprising:

cooling the wafer with the cooling means during the etch to a temperature less than or equal to about 0° C.

8. The dry etching method of claim 1 wherein the minimum amount of electrical power is greater than or equal to about 50W, and further comprising:

cooling the wafer with the cooling means during the etch to a temperature between about 0° C. and $-70°$ C.

9. The dry etching method of claim 1 wherein the other gas is selected from the group consisting of noble gases and $N_2$, and mixtures thereof.

10. The dry etching method of claim 9 wherein the minimum amount of electrical power is greater than or equal to about 50W.

11. The dry etching method of claim 9 wherein the minimum amount of electrical power is greater than or equal to about 50W, and further comprising:

cooling the wafer with the cooling means during the etch to a temperature less than 20° C.

12. The dry etching method of claim 9 wherein the minimum amount of electrical power is greater than or equal to about 50W, and further comprising:
cooling the wafer with the cooling means during the etch to a temperature less than or equal to about 0° C.

13. The dry etching method of claim 9 comprising cooling the wafer with the cooling means during the etch to a temperature less than 20° C.

14. The dry etching method of claim 9 comprising cooling the wafer with the cooling means during the etch to a temperature less than or equal to about 0° C.

15. A method of preventing low temperature dry etch deposit on a semiconductor substrate wafer comprising:
ceasing injection of reactive gas to within a dry etching reactor at substantial completion of a selective etch while maintaining sufficient power to the reactor to maintain gases therein in a plasma state; and
evacuating a significant portion of the reactive gas from the reactor before decreasing power to the reactor below that which is sufficient to maintain gases therein in the plasma state.

16. The method of preventing low temperature dry etch deposit of claim 15 wherein the step of substantially evacuating the reactive gas plasma from the reactor comprises:
maintaining a vacuum suction force in an evacuation opening communicating with the reactor while injection of gases into the reactor has substantially ceased.

17. The method of preventing low temperature dry etch deposit of claim 15 wherein the step of substantially evacuating the reactive gas plasma from the reactor comprises:
injecting an inert purge gas into the reactor while injection of the reactive gas has substantially ceased to expel the reactive gas from the reactor, the inert purge gas being inert to reaction with material on the wafer.

18. The dry etching method of claim 15 further comprising cooling the wafer during the selective etch to a temperature less than 20° C.

19. The dry etching method of claim 15 further comprising cooling the wafer during the selective etch to a temperature less than or equal to about 0° C.

20. The dry etching method of claim 15 further comprising cooling the wafer during the selective etch to a temperature less than 20° C.; and
wherein the step of substantially evacuating the reactive gas plasma from the reactor comprises:
maintaining a vacuum suction force in an evacuation opening communicating with the reactor while injection of gases into the reactor has substantially ceased.

21. The dry etching method of claim 15 further comprising cooling the wafer during the selective etch to a temperature less than or equal to about 0° C.; and
wherein the step of substantially evacuating the reactive gas plasma from the reactor comprises:
maintaining a vacuum suction force in an evacuation opening communicating with the reactor while injection of gases into the reactor has substantially ceased.

22. The dry etching method of claim 15 further comprising cooling the wafer during the selective etch to a temperature less than 20° C.; and
wherein the step of substantially evacuating the reactive gas plasma from the reactor comprises:
injecting an inert purge gas into the reactor while injection of the reactive gas has substantially ceased to expel the reactive gas from the reactor, the inert purge gas being inert to reaction with material on the wafer.

23. The dry etching method of claim 15 further comprising cooling the wafer during the selective etch to a temperature less than or equal to about 0° C.; and
wherein the step of substantially evacuating the reactive gas plasma from the reactor comprises:
injecting an inert purge gas into the reactor while injection of the reactive gas has substantially ceased to expel the reactive gas from the reactor, the inert purge gas being inert to reaction with material on the wafer.

* * * * *

UNITED STATES PATENT AND TRADEMARK OFFICE
CERTIFICATE OF CORRECTION

PATENT NO. : 4,992,137

DATED : February 12, 1991

INVENTOR(S) : David A. Cathey and Harlan Frankamp

It is certified that error appears in the above-identified patent and that said Letters Patent is hereby corrected as shown below:

At column 2, lines 15 and 16, delete "of $SiO_2$ which is selective to silicon".

Signed and Sealed this

Twenty-fifth Day of August, 1992

Attest:

DOUGLAS B. COMER

Attesting Officer

Acting Commissioner of Patents and Trademarks